US010090447B2

(12) United States Patent
Zhou et al.

(10) Patent No.: US 10,090,447 B2
(45) Date of Patent: Oct. 2, 2018

(54) LED LIGHT-EMITTING DEVICE

(71) Applicant: Ningbo Yamao Optoelectronics Co., Ltd., Zhejiang (CN)

(72) Inventors: Yinyong Zhou, Zhejiang (CN); Qili Xu, Zhejiang (CN); Hu Fang, Zhejiang (CN)

(73) Assignee: NINGBO YAMAO OPTOELECTRONICS CO., LTD., Zhenjiang (CN)

( * ) Notice: Subject to any disclaimer, the term of this patent is extended or adjusted under 35 U.S.C. 154(b) by 9 days.

(21) Appl. No.: 15/710,222

(22) Filed: Sep. 20, 2017

(65) Prior Publication Data

US 2018/0248089 A1    Aug. 30, 2018

(30) Foreign Application Priority Data

Feb. 27, 2017 (CN) .......................... 2017 1 0109328

(51) Int. Cl.
*H01L 33/64*     (2010.01)
*H01L 33/62*     (2010.01)
*H01L 33/60*     (2010.01)

(52) U.S. Cl.
CPC ............ *H01L 33/60* (2013.01); *H01L 33/642* (2013.01); *H01L 33/62* (2013.01)

(58) Field of Classification Search
CPC ......... H01L 33/60; H01L 33/62; H01L 33/64; H01L 33/642; H01L 33/648; H01L 33/00; H01L 33/501; H01L 33/502; H01L 33/73; H01L 33/641; H01L 33/50; H01L 33/42; H01L 23/3121; H01L 2924/12041

See application file for complete search history.

(56) References Cited

U.S. PATENT DOCUMENTS

| | | | | |
|---|---|---|---|---|
| 2009/0078957 | A1* | 3/2009 | Hoshina | H01L 33/54 257/98 |
| 2011/0095686 | A1* | 4/2011 | Falicoff | F21V 29/75 315/35 |
| 2011/0318886 | A1* | 12/2011 | Tsao | H05K 3/1208 438/125 |
| 2015/0023023 | A1* | 1/2015 | Livesay | H01L 33/642 362/294 |

\* cited by examiner

*Primary Examiner* — Caridad Everhart
(74) *Attorney, Agent, or Firm* — Andrew F. Young, Esq.; Lackenbach Siegel, LLP

(57) ABSTRACT

The invention relates to the field of illumination, more specifically, to an LED light-emitting device. The LED light-emitting device comprises a heat dissipation layer for transferring the heat which is generated during operating of a circuit layer arranged in the LED light-emitting device to external environment of the LED light-emitting device, the heat dissipation layer being a metal substrate; wherein the circuit layer is arranged below the heat dissipation layer, and the circuit layer has a same shape with the heat dissipation layer.

7 Claims, 5 Drawing Sheets

LED LIGHT-EMITTING DEVICE

CROSS-REFERENCE TO RELATED APPLICATIONS

The present application claims priority to and the benefit of Chinese Patent Application No. CN 201710109328.0, filed on Feb. 27, 2017, the entire content of which is incorporated herein by reference.

BACKGROUND OF THE INVENTION

1. Field of the Invention

The invention relates to the field of illumination, more specifically, to an LED light-emitting device.

2. Description of the Related Art

Generally, LED light and LED lamp consist of light source, power source, structural members and connecting pieces, the structure like this restricts the design of LED light and LED lamp. Usually there is a need to consider the placement and the space of the power source. If the appearance and the safety of the LED light and the LED lamp are met, the heat dissipation thereof is affected at the same time.

Moreover, the separate arrangement of the power source and the light source leads to a low efficiency in assembling, which lowers the yield as well as the quality of the assembling. It is more complex to design the LED light and LED lamp in safety class, which increases the costs.

SUMMARY OF THE INVENTION

In view of the problems mentioned above in the prior art, the present invention provides an LED light-emitting device, which can solve the problems caused by the separate arrangement of the power source and the light source, to provide good performance in heat dissipation, small size for the products, and low cost in manufacturing.

An LED light-emitting device, comprising:

a heat dissipation layer for transferring the heat which is generated during operating of a circuit layer arranged in the LED light-emitting device to external environment of the LED light-emitting device, the heat dissipation layer being a metal substrate;

wherein, the circuit layer is arranged below the heat dissipation layer, and the circuit layer has a same shape with the heat dissipation layer;

the circuit layer further comprises:

a fixing layer for fixing the circuit layer below the heat dissipation layer, the fixing layer having a same shape with the heat dissipation layer;

a power source unit, arranged at a lower surface of the fixing layer, for supplying power to the LED light-emitting device;

at least one light-emitting unit, arranged at the lower surface of the fixing layer and electronically connected to the power source unit, for transforming electric energy provided by the power source unit into light energy so as to achieve light-emitting function of the LED light-emitting device.

Further, the above LED light-emitting device, wherein the at least one light-emitting unit and the power source unit are formed by SMD (Surface Mounted Device).

Further, the above LED light-emitting device, wherein the at least one light-emitting unit and the power source unit are welded to the lower surface of the fixing layer by SMT (Surface Mount Technology) respectively.

Further, the above LED light-emitting device, wherein the light-emitting unit and the power source unit are welded to the lower surface of the fixing layer by reflow soldering separately or simultaneously.

Further, the above LED light-emitting device, wherein an upper surface and a lower surface of the fixing layer are covered with a layer of white ink respectively, so that a function of light reflecting is achieved.

Further, the above LED light-emitting device, wherein the fixing layer is a flexible substrate.

Further, the above LED light-emitting device, wherein the fixing layer is a rigid substrate.

The invention has the following advantages:

The dimension of the LED light-emitting device and the costs for manufacturing the LED light-emitting device are greatly reduced, and the service life of the LED light-emitting device is prolonged. As a result, the social resources are greatly saved.

BRIEF DESCRIPTIONS OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
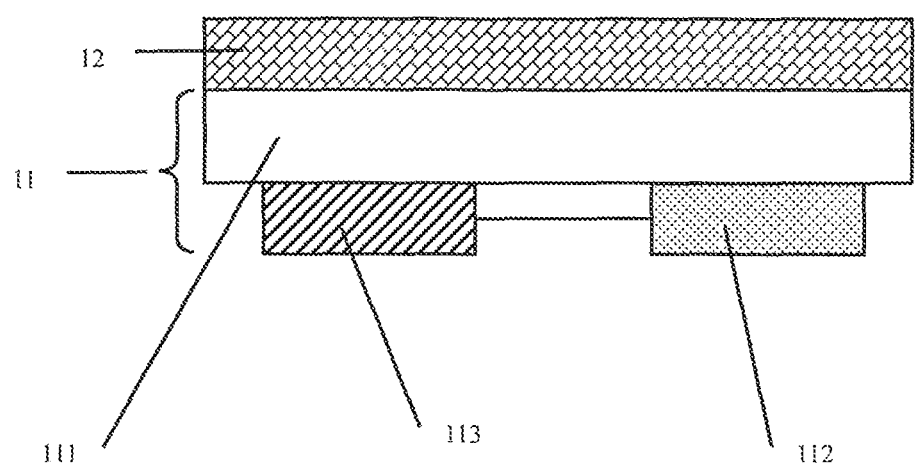
FIG. 1 is a structure diagram of an LED light-emitting device according to an embodiment of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs, it will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning, that the term "around", "about" or "approximately" can be inferred if not expressly stated.

As used herein, the term "plurality" means a umber greater than one.

Hereinafter, certain exemplary embodiments according to the present disclosure will be described with reference to the accompanying drawings.

In view of the problems in the prior art, the present application provides an LED light-emitting device with small size and long service life. The structure of the device is shown in FIG. 1. The LED light-emitting device comprises:

a heat dissipation layer 12 for transferring the heat which is generated during the operating of a circuit layer 11 arranged in the LED light-emitting device to the external environment of the LED light-emitting device, and the heat dissipation layer 12 being a metal substrate;

a circuit layer 11, arranged below the heat dissipation layer 12, the circuit layer 11 having a same shape with the heat dissipation layer 12;

the circuit layer 11 further comprising:

a fixing layer 111 for fixing the circuit layer 11 below the heat dissipation layer 12, the fixing layer 111 having a same shape with the heat dissipation layer 12;

a power source unit 113, arranged at a lower surface of the fixing layer 111, for supplying power to the LED light-emitting device; a light-emitting unit 112 being electrically connected to the power source unit 113, the power source unit 113 transforming alternating current into direct current, the power source unit 113 being an AC/DC transforming module;

at least one light-emitting unit 112, arranged at the lower surface of the fixing layer 111 and electrically connected to the power source unit 113, for transforming electric energy provided by the power source unit 113 into light energy so as to achieve the light-emitting function of the LED light-emitting device.

Figure 2:
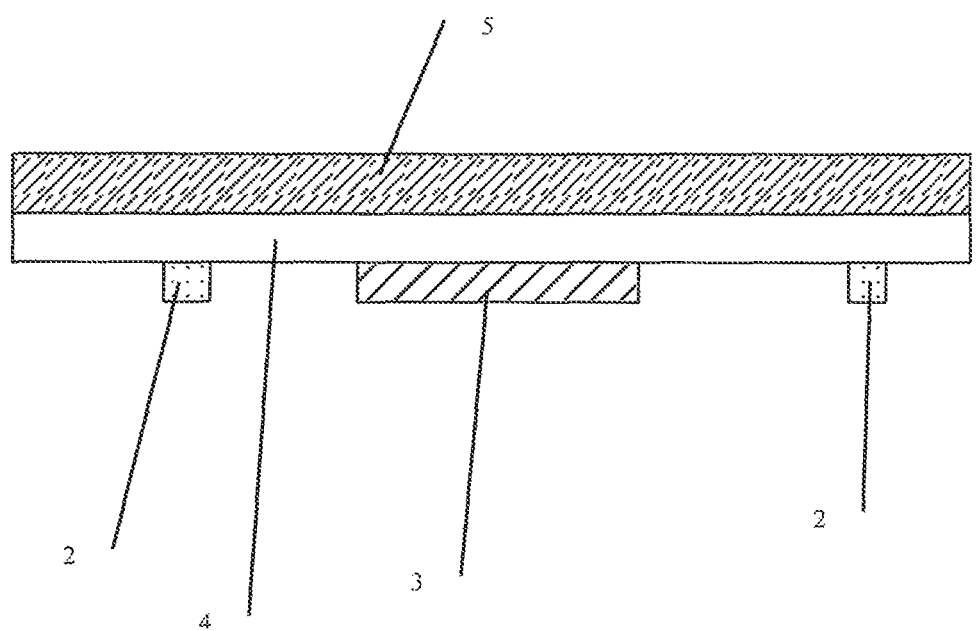
FIG. 2 is a structure diagram of an arrangement of light-emitting units according to an embodiment of the present invention.

Specifically, in a preferred embodiment of the present application, as shown in FIG. 2, each one of the light-emitting units 112 consists of a plurality of LED beads 2, the power source unit 113 consists of a power supply module 3, the fixing layer 111 is a circuit board 4 fully printed with white ink on its surface.

The power supply module 3 can transform alternating current into direct current, and can output current in a plurality of modes. The plurality of modes comprise direct current, linear constant current power supply, and regulated direct current, which have duty cycle. The power supply module 3 has an input end and an output end. The input end of the power supply module 3 receives alternating current, and the output end of the power supply module 3 outputs direct current. The LED beads 2 connect to the output end of the power supply module 3 in parallel. The plurality of LED beads 2 are connected to each other in parallel or in series.

The heat dissipation layer corresponds to the metal substrate 5 as shown in FIG. 2. The metal substrate 5 helps in heat dissipation for the circuit board 4.

In conclusion, the present application, provides an LED light-emitting device, in which the light-emitting unit 112 is integral with the power source unit 113. Therefore, an external power source used in the prior art is not necessary to the device of the present application, which reduces the size of the device. It greatly saves social resources and improves resource utilization rate in production and daily life, it really achieves environmental protection and energy saving. Therefore, the device has a good performance while its size is reduced.

Figure 3:
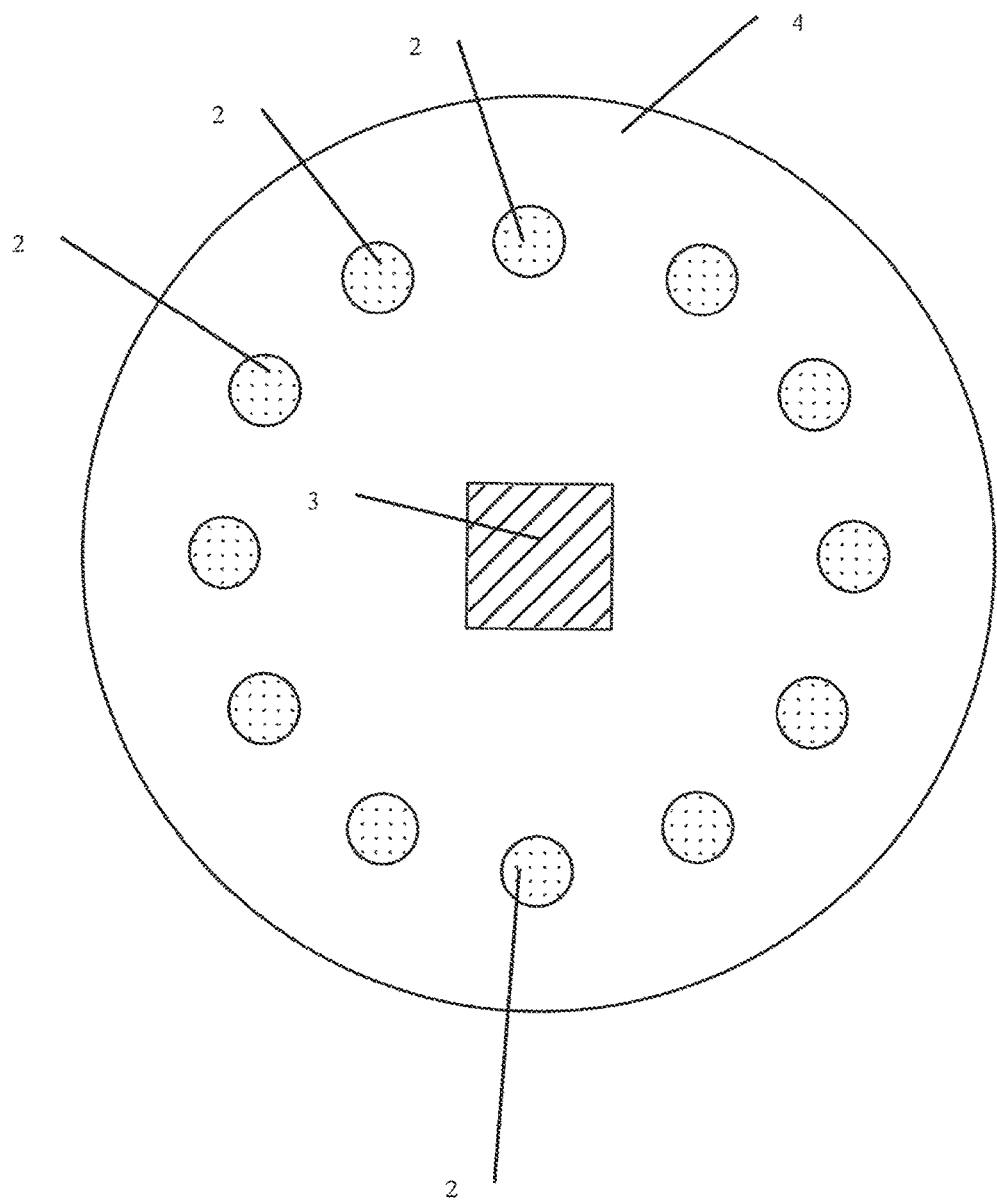
FIG. 3 is a bottom view of FIG. 2 according to an embodiment of the present invention.

As shown in FIG. 3, the power supply module 3 is arranged at center of the circuit board 4, and is surrounded with a plurality of LED beads 2.

Figure 4:
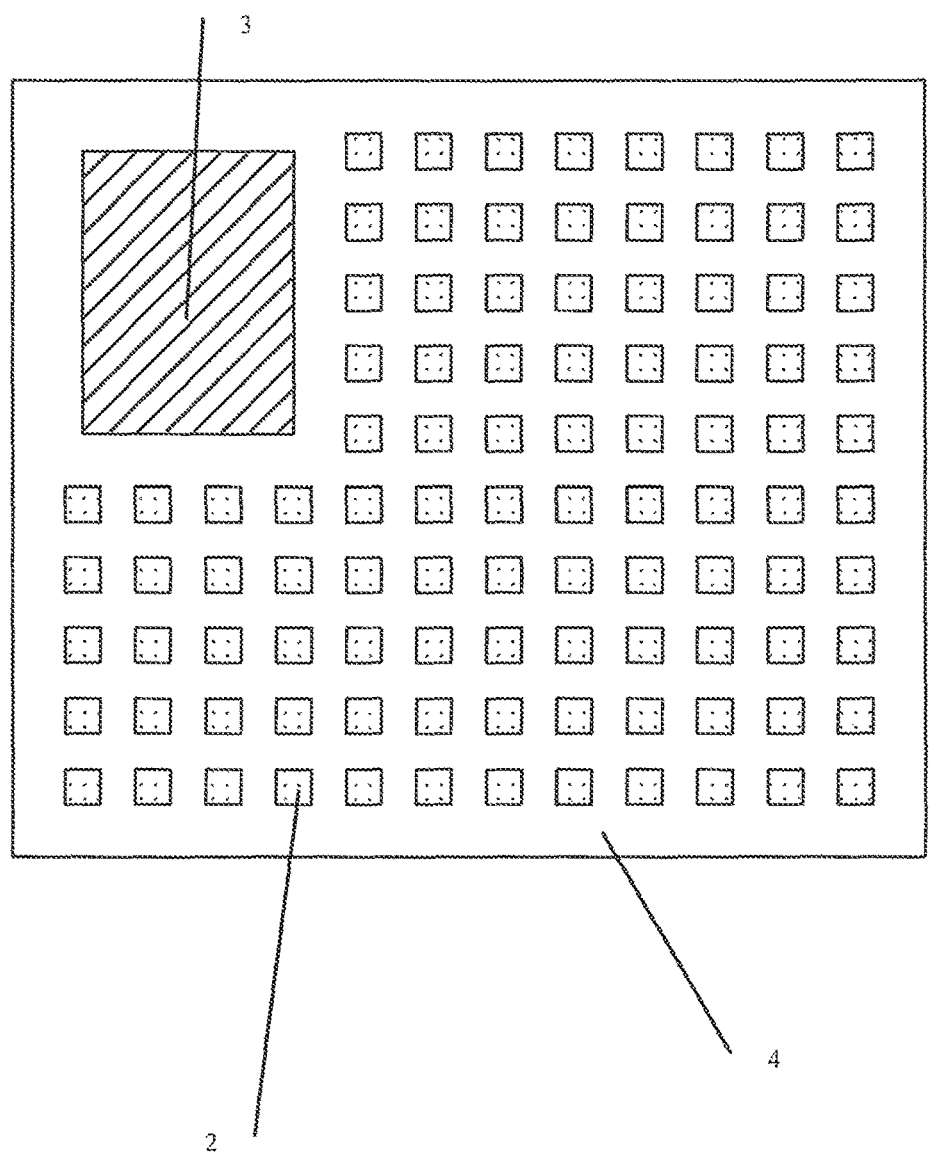
FIG. 4 is a structure diagram of an arrangement of light-emitting units according to an embodiment of the present invention.

As shown in FIG. 4, the power supply module 3 is arranged at a corner of the circuit board 4, and a plurality of LED beads 2 are arranged at the rest positions of the circuit board 4.

Specifically, in a preferred embodiment of the present application, as shown in FIGS. 2 and 4, the position of the LED beads 2 and the position of the power supply module 3 can be changed according to the requirements. The position of the LED beads 2 and the position of the power supply module 3 wilt be changed with the change of use, shape and the like of the LED light-emitting device.

In a preferred embodiment of the present invention, the light-emitting unit 112 and the power source unit 113 are formed by SMD (Surface Mounted Device).

In a preferred embodiment of the present invention, the light-emitting unit 112 and the power source unit 113 are welded to the lower surface of the fixing layer 111 by SMT (Surface Mount Technology) separately or simultaneously.

In a preferred embodiment of the present invention, the light-emitting unit 112 and the power source unit 113 are welded to the lower surface of the fixing layer 111 by reflow soldering separately.

Specifically, in a preferred embodiment of the technical solution, the elements on the circuit board 4 are welded by SMD. The welding process is performed by SMT or reflow soldering. During the welding process, solder paste is daubed on the bonding pad of the circuit board 4, SMD is hot welded to the circuit board 4 by a welding device. The whole welding process can be done by a SMT welding device or a reflow soldering device without manual intervention.

In a preferred embodiment of the present application, the upper surface and the lower surface of the fixing layer 111 are covered with a layer of white ink respectively, so that a function of light reflecting is achieved.

Specifically, in a preferred embodiment of the present application, the white ink on the circuit board 4 is used for reflecting lights.

Figure 5:
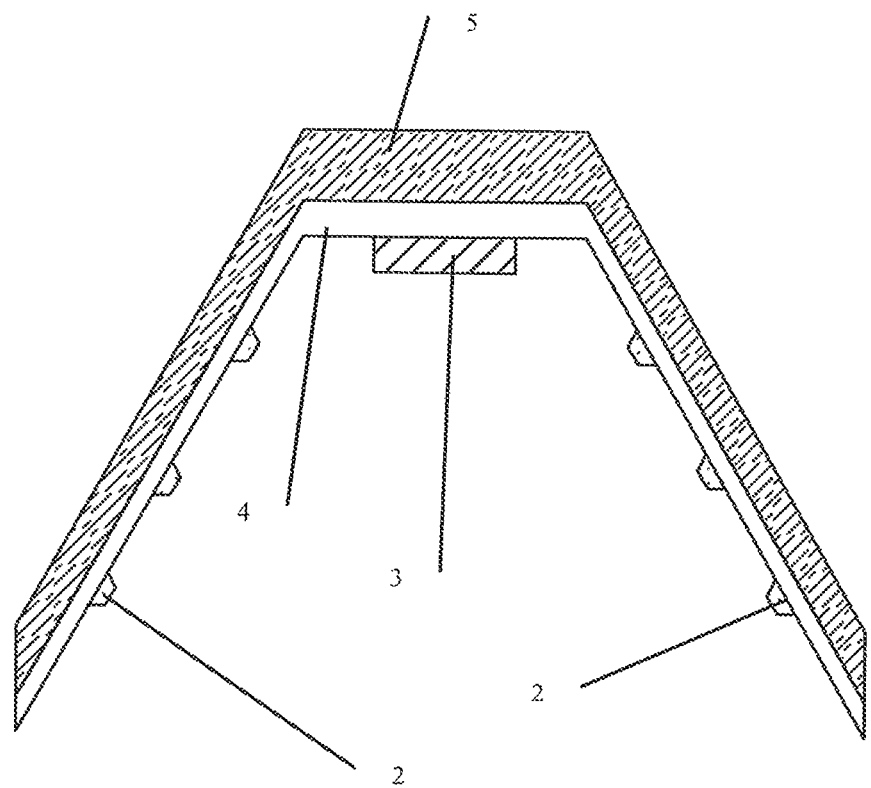
FIG. 5 is a schematic diagram of arrangement of a fixing layer according to an embodiment of the present invention.

Specifically, in a preferred embodiment of the present application, the circuit hoard 4 and the metal substrate 5 can be of any shape. In an embodiment as shown in FIG. 3, the circuit board 4 and the metal substrate 5 are of round shape. In an embodiment as shown in FIG. 4, the circuit board 4 and the metal substrate 5 are of rectangle shape. In practical manufacturing process, the shape of the circuit board 4 and the metal substrate 5 are not limited. Even the three-dimensional shape as shown in FIG. 5 can be achieved by those skilled in the art.

In a preferred embodiment of the present application, the fixing layer 111 is a flexible printed-circuit board.

In a preferred embodiment of the present application, the fixing layer 111 is a rigid printed-circuit board.

Specifically, in a preferred embodiment of the present application, when the fixing layer 111 is made of rigid material, the circuit board 4 is plane, as shown in FIGS. 2 to 4. When the fixing layer 111 is made of flexible material, the circuit board 4 can be plane or three-dimensional. The three-dimensional fixing layer 111 can be configured as shown in FIG. 5.

The foregoing is only the preferred embodiments of the invention, not thus limiting embodiments and scope of the invention, those skilled in the art should be able to realize that the schemes obtained from the content of specification and figures of the invention are within the scope of the invention.

What is claimed is:

1. An LED light-emitting device, comprising:
   a heat dissipation layer, for transferring the heat which is generated during operation of a circuit layer arranged in the LED light-emitting device to external environment of the LED light-emitting device, the heat dissipation layer being a metal substrate;
   wherein, the circuit layer is arranged below the heat dissipation layer, and the circuit layer has a same shape with the heat dissipation layer;
   the circuit layer further comprises:
      a fixing layer for fixing the circuit layer below the heat dissipation layer, the fixing layer having a same shape with the heat dissipation layer;
      a power source unit, arranged at a lower surface of the fixing layer, for supplying power to the LED light-emitting device;
      at least one light-emitting unit, arranged at the lower surface of the fixing layer and electronically connected to the power source unit, for transforming electric energy provided by the power source unit into light energy so as to achieve light-emitting function of the LED light-emitting device; and
      wherein an upper surface and a lower surface of the fixing layer are covered with a layer of white ink respectively, so that a function of light reflecting is achieved.

2. The LED light-emitting device as claimed in claim 1, wherein the at least one light-emitting unit and the power source unit are formed by SMD (Surface Mounted Device).

3. The LED light-emitting device as claimed in claim 1, wherein the at least one light-emitting unit and the power source unit are welded to the lower surface of the fixing layer by SMT (Surface Mount Technology) respectively.

4. The LED light-emitting device as claimed in claim 1, wherein the light-emitting unit and the power source unit are welded to the lower surface of the fixing layer by reflow soldering separately or simultaneously.

5. The LED light-emitting devices claimed in claim 1, wherein the fixing layer is a flexible substrate.

6. The LED light-emitting device as claimed in claim 1, wherein the fixing layer is a rigid substrate.

7. The LED light-emitting devices, comprising:
   a heat dissipation layer, for transferring the heat which is generated during operation of a circuit layer arranged in the LED light-emitting device to external environment of the LED light-emitting device, the heat dissipation layer being a metal substrate;
   wherein, the circuit layer is arranged below the heat dissipation layer, and the circuit layer has a same shape with the heat dissipation layer;
   the circuit layer further comprises:
   a fixing layer for fixing the circuit layer below the heat dissipation layer, the fixing layer having a same shape with the heat dissipation layer;
   a power source unit, arranged at a lower surface of the fixing layer, for supplying power to the LED light-emitting device;
   at least one light-emitting unit, arranged at the lower surface of the fixing layer and electronically connected to the power source unit, for transforming electric energy provided by the power source unit into light energy so as to achieve light-emitting function of the LED light-emitting device; and
   wherein the fixing layer is a flexible substrate.

* * * * *